United States Patent
Li

(10) Patent No.: US 9,977,111 B2
(45) Date of Patent: May 22, 2018

(54) REFERENCE VOLTAGE TEMPERATURE COEFFICIENT CALIBRATION CIRCUIT AND METHOD

(71) Applicant: KT MICRO, INC., Beijing (CN)

(72) Inventor: Haojiong Li, Beijing (CN)

(73) Assignee: KT MICRO, INC., Beijing (CN)

( * ) Notice: Subject to any disclaimer, the term of this patent is extended or adjusted under 35 U.S.C. 154(b) by 301 days.

(21) Appl. No.: 14/957,096

(22) Filed: Dec. 2, 2015

(65) Prior Publication Data

US 2016/0187207 A1 Jun. 30, 2016

(30) Foreign Application Priority Data

Dec. 26, 2014 (CN) .......................... 2014 1 0833639

(51) Int. Cl.
| | |
|---|---|
| *G01K 15/00* | (2006.01) |
| *G01K 7/00* | (2006.01) |
| *G01R 35/00* | (2006.01) |
| *G05F 3/02* | (2006.01) |
| *G05F 3/30* | (2006.01) |

(52) U.S. Cl.
CPC ............ *G01R 35/007* (2013.01); *G05F 3/02* (2013.01); *G05F 3/30* (2013.01)

(58) Field of Classification Search
USPC .................................................... 374/1, 178
See application file for complete search history.

(56) References Cited

U.S. PATENT DOCUMENTS

| | | | | |
|---|---|---|---|---|
| 3,652,934 A | * | 3/1972 | Paljug ...................... | G06G 7/24 324/115 |
| 2008/0265860 A1 | * | 10/2008 | Dempsey .................. | G05F 3/30 323/314 |
| 2015/0137896 A1 | * | 5/2015 | Gajda ....................... | H03L 1/02 331/57 |
| 2016/0266598 A1 | * | 9/2016 | Wong ........................ | G05F 3/30 |

* cited by examiner

*Primary Examiner* — Mirellys Jagan
(74) *Attorney, Agent, or Firm* — Andrew C. Cheng

(57) ABSTRACT

The present invention relates to a reference voltage temperature coefficient calibration circuit. The circuit comprises: an operational amplifier comprising an input pair transistor, a load pair transistor, and a bias current source, an inverted input terminal of the operational amplifier being connected to an output terminal of the operational amplifier; and an adjustable current module connected in parallel to the load pair transistor, the adjustable current module being configured to generate an adjusting current, the adjusting current being used to adjust an offset current flowing through the input pair transistor, wherein the adjusting current is related to a current of the bias current source and an order of Kelvin temperature. The present invention is applicable to calibration of first-order to high-order temperature coefficients of a reference voltage in a circuit, and has universality.

10 Claims, 5 Drawing Sheets

REFERENCE VOLTAGE TEMPERATURE COEFFICIENT CALIBRATION CIRCUIT AND METHOD

TECHNICAL FIELD

The present invention relates to the field of integrated circuits, and more particularly, relates to a reference voltage temperature coefficient calibration circuit and method.

BACKGROUND

The reference voltage source is an extremely important component of an analog integrated circuit. For an analog-to-digital/digital-to-analog conversion circuit, a low voltage drop linear regulator circuit, and various sensors (for example, a temperature sensor, a pressure sensor and the like), the precision of the reference voltage determines the maximum precision of the circuits. The reference voltage source is mainly categorized into a buried Zener reference voltage source, an extract implantation junction field effect transistor (XFET) reference voltage source, and a bandgap reference voltage source. The bandgap reference voltage source is categorized into a bipolar bandgap reference voltage source and a sub-threshold complementary metal oxide semiconductor (CMOS) bandgap reference voltage source.

An ideal reference voltage source is capable of providing a voltage irrelevant to the voltage of the power supply, the temperature, and the process. However, in practice, such factors as discreteness of the process may cause a significant impact on the precision of the reference voltage. In this case, the reference voltage needs to be adjusted. A traditional adjusting method is generally adjusting the resistance or the current in the circuit of the reference voltage source, and adjusting the value of the reference voltage by disconnecting or connecting some resistors or by reducing or increasing some currents. Adjustment of the voltage in the reference voltage source may be implemented by adjusting the temperature coefficient (TC). The temperature coefficient represents a proportion of voltage variation of the reference voltage within a specific temperature variation range (the lowest temperature $T_L$ to the highest temperature $T_H$). The formula for calculating the temperature coefficient is Equation (1):

$$TC = \frac{V_{REF}(\max) - V_{REF}(\min)}{V_{REF}(\text{average})(T_H - T_L)} \times 10^6 \text{ ppm/}^\circ\text{C}. \tag{1}$$

In the above equation, $(T_H - T_L)$ is a temperature variation range, $V_{REF}(\max)$ is a maximum value of the reference voltage within the temperature variation range, $V_{REF}(\min)$ is a minimum value of the reference voltage within the temperature variation range, $V_{REF}(\text{average})$ is an average value of the reference voltage within the temperature variation range, and ppm/°C. is the unit of the temperature coefficient.

Adjustment of the temperature coefficient involves adjustment of the temperature compensation proportion of the reference voltage, and is generally related to the structure of the reference voltage source. In the prior art, for different reference voltage sources, different adjusting methods may be used to adjust the temperature coefficients, thereby implementing calibration of the reference voltage. For example, with respect to a traditional bipolar bandgap reference voltage source, the emitter-base voltage of a PNP transistor has a negative temperature coefficient, whereas a difference of the emitter-base voltages of two PNP transistors operating in different current densities has a positive temperature coefficient. Therefore, theoretically a reference voltage irrelevant to the temperature may be obtained by means of addition of these two voltages at different proportions.

Referring to FIG. 1, a schematic structural diagram illustrating a circuit of a typical Banba reference voltage source in the prior art is given. R1, R2, R3, and R4 are resistors with adjustable resistance, a current ratio of a p-type metal-oxide-semiconductor (PMOS) transistor P1 to a PMOS transistor P2 is 1:1, a current ratio of the PMOS transistor P2 to a PMOS transistor P3 is 1:1, an emitter junction area ratio of a PNP transistor P4 to a PNP transistor P5 is 1:n, and a voltage of the emitter-base of the PNP transistor P4 is $V_{EB}$. In this case, the reference voltage is represented by Equation (2):

$$V_{REF} = \frac{R_3}{R_2}\left(V_{EB} + \frac{R_1}{R_2} V_T \ln n\right) \tag{2}$$

In the above equation, $V_T = kT/q$, wherein k is a Boltzmann constant, q is a quantity of electron charge, and T is a Kelvin temperature. According to Equation (2), the first-order temperature coefficient is related to $R_1$ and $R_2$. Therefore, by adjusting the value of $R_2$ or $R_1$, the proportion of the kT/q (that is, $V_T$) is changed, to achieve adjustment of the first-order temperature coefficient, thereby implementing calibration of the reference voltage. The calibration precision depends on the design indicators of the reference voltage source. However, such method for adjusting the temperature coefficient is subject to some limitations. In one aspect, such adjusting method is dependent on the specific structure and implementation manner of the reference voltage source, and has no universality, which is thus not applicable to a reference voltage source without resistor, for example, a buried Zener reference voltage source, an XFET reference voltage source, and a sub-threshold CMOS bandgap reference voltage source. In addition, since the sub-threshold CMOS bandgap reference voltage source practically has smaller current and component size, adjustment of the reference voltage is hard to implement. In another aspect, such adjusting method is capable of only implementing adjustment of the first-order temperature coefficient. However, with respect to a bandgap reference voltage source, the second-order temperature coefficient of about 10 ppm/°C. is generally included; or with respect to a system requiring a precision of above 12 bits, a relatively complicated high-order temperature compensation circuit needs to be configured. Such high-order compensation circuit generally induces component mismatch to some extent, thereby causing offset of the reference voltage.

SUMMARY

The present invention provides a reference voltage temperature coefficient calibration circuit and method for calibrating first-order to high-order temperature coefficients of the reference voltage in the circuit, which have universality.

The present invention provides a reference voltage temperature coefficient calibration circuit, comprising:

an operational amplifier comprising an input pair transistor, a load pair transistor, and a bias current source, an inverting input terminal of the operational amplifier being connected to an output terminal of the operational amplifier; and an adjustable current module connected in parallel to the load pair transistor, the adjustable current module being configured to generate an adjusting current, the adjusting current being used to adjust an offset current flowing through the input pair transistor, wherein the adjusting current is related to a current of the bias current source and an order of Kelvin temperature.

The present invention provides a reference circuit calibration method, comprising:

providing an operational amplifier, the operational amplifier comprising an input pair transistor, a load pair transistor, and a bias current source, an inverting input terminal of the operational amplifier being connected to an output terminal of the operational amplifier; and providing an adjustable current module, the adjustable current module being connected in parallel to the load pair transistor, the adjustable current module being configured to generate an adjusting current, the adjusting current being used to adjust an offset current flowing through the input pair transistor, wherein the adjusting current is related to a current of the bias current source and an order of Kelvin temperature.

According to the present invention, a circuit comprising an operational amplifier and an adjustable current module is employed to calibrate the temperature coefficient of the reference voltage. The offset current flowing through the input pair transistor is adjusted by using an adjusting current generated by the adjustable current module. Since the adjusting current is related to the current at the bias current source in the operational amplifier and the order of the Kelvin temperature, the offset current is adjusted by adjusting the adjusting current according to different temperature orders. In this way, the first-order to high-order temperature coefficients of the offset voltage are adjusted, the temperature coefficient of the reference voltage is calibrated, and universality is achieved.

DETAILED DESCRIPTION

The present invention is further described with reference to the drawings and exemplary embodiments.

Figure 1:
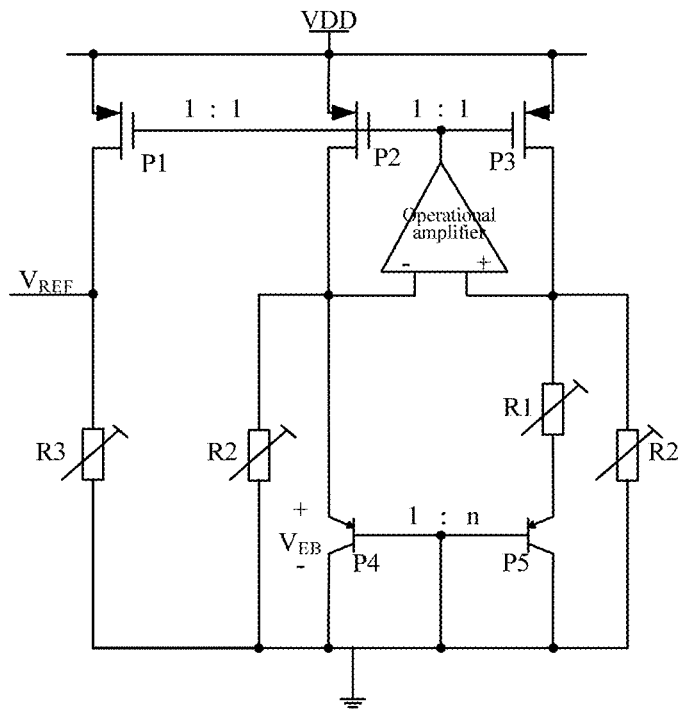
FIG. 1 is a schematic structural diagram illustrating a circuit of a typical Banba reference voltage source in the prior art.
Figure 2:
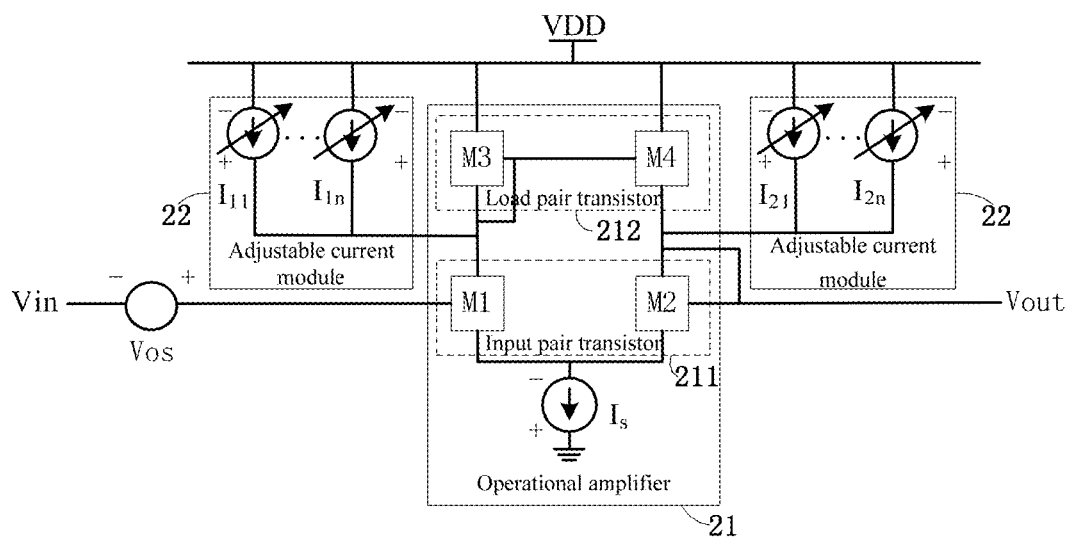
FIG. 2 is a schematic structural diagram illustrating a reference voltage temperature coefficient calibration circuit according to an embodiment of the present invention.

Referring to FIG. 2, a schematic structural diagram of a reference voltage temperature coefficient calibration circuit according to an embodiment of the present invention is given. The circuit may comprise an operational amplifier 21 and an adjustable current module 22, wherein a non-inverting input terminal of the operational amplifier 21 has a reference voltage $V_{in}$ before calibration, and an offset voltage $V_{os}$ exists at the reference voltage $V_{in}$ before calibration; an output terminal of the operational amplifier 21 has a calibrated reference voltage $V_{out}$ after a temperature coefficient of the offset voltage is adjusted, and $V_{out}=V_{in}+V_{in}$. An inverting input terminal of the operational amplifier 21 is connected to the output terminal of the operational amplifier 21. The operational amplifier 21 may comprise an input pair transistor 211, a load pair transistor 212, and a bias current source I, wherein the input pair transistor 211 comprises a transistor M1 and a transistor M2, the load pair transistor 212 comprises a transistor M3 and a transistor M4, and the adjustable current module 22 is connected in parallel to the load pair transistor 212.

Specifically, referring to the schematic structural diagram in FIG. 2, the transistor M1 is connected to the reference voltage $V_{in}$ before calibration, the transistor M2 is connected to the reference voltage $V_{out}$ after calibration, the transistor M3 is connected in parallel to the adjustable current module 22 after being connected in series to the transistor M1, the transistor M4 is connected in parallel to the adjustable current module 22 after being connected in series to the transistor M2 and connected to the calibrated reference voltage $V_{out}$ after being connected to the transistor M2, the transistor M3, the transistor M4 and the adjustable current module 22 are all connected to a power source $V_{DD}$, the transistor M1 and the transistor M2 are all connected to the bias current source $I_s$, and the positive pole of the bias current source $I_s$ is connected to the ground.

Figure 3:
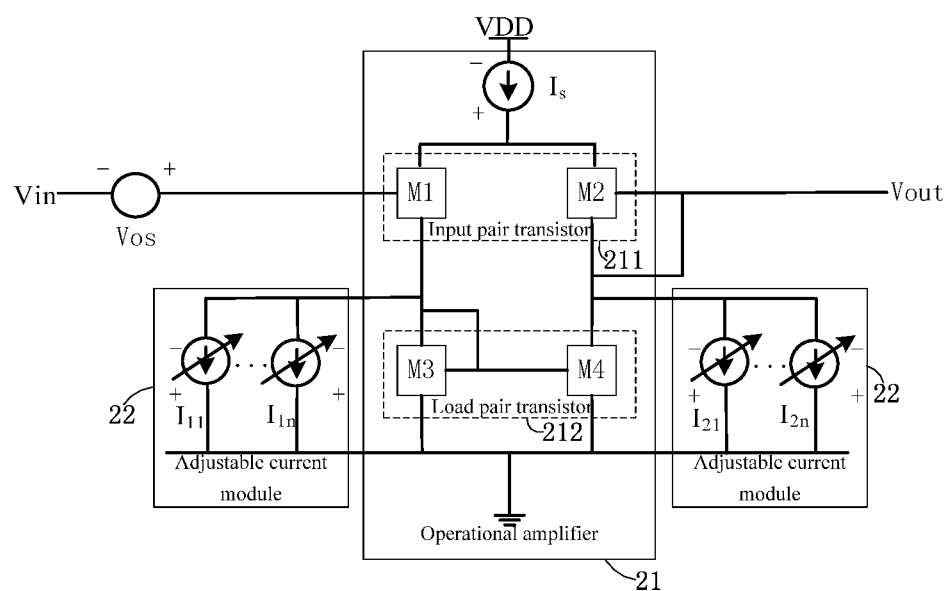
FIG. 3 is another schematic structural diagram illustrating a reference voltage temperature coefficient calibration circuit according to an embodiment of the present invention.

Referring to FIG. 3, another schematic structural diagram of a reference voltage temperature coefficient calibration circuit according to an embodiment of the present invention is given. The differences between FIG. 2 and FIG. 3 lie in that: The transistor M3, the transistor M4 and the adjustable current module 22 are all connected to the ground, and the transistor M1 and the transistor M2 are all connected to the positive pole of the bias current source $I_s$, and the negative pole of the bias current source $I_s$ is connected to the power source $V_{DD}$.

In this embodiment, the adjustable current module 22 is configured to generate an adjusting current, the adjusting current being used to adjust an offset current flowing through the input pair transistor 211, wherein the adjusting current is related to a current of the bias current source $I_s$ and an order of Kelvin temperature.

The specific working process of this embodiment is as follows: An operational amplifier 21 is provided, which comprises an input pair transistor 211, a load pair transistor 212 and a bias current source $I_s$, wherein an inverting input terminal of the operational amplifier 21 is connected to an output terminal of the operational amplifier 21; and an adjustable current module 22 is provided, which is connected in parallel to the load pair transistor 212, wherein the adjustable current module 22 is configured to generate an adjusting current, the adjusting current being used to adjust an offset current flowing through the input pair transistor 211, wherein the adjusting current is related to a current of the bias current source $I_s$ and an order of Kelvin temperature.

Figure 4:
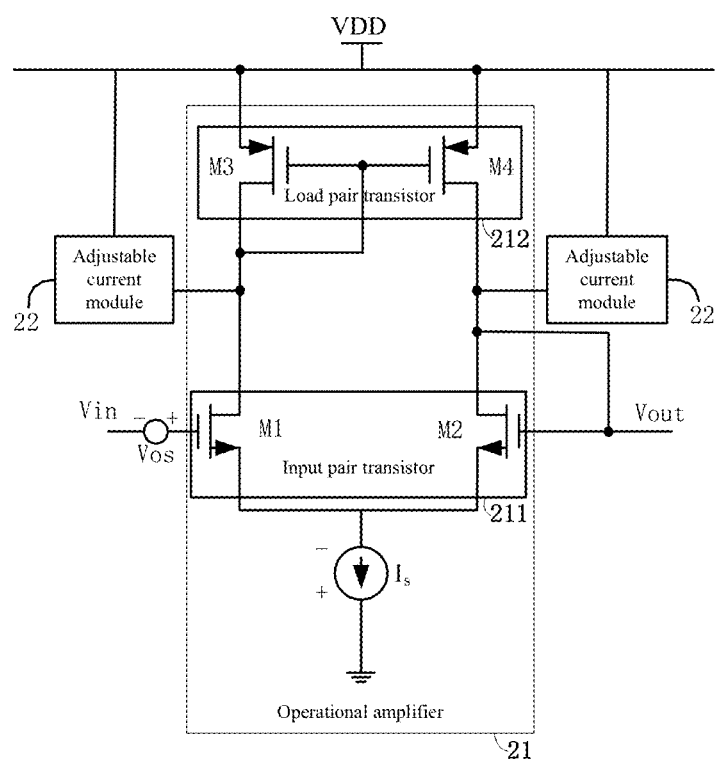
FIG. 4 is a schematic structural diagram illustrating a reference voltage temperature coefficient calibration circuit according to a first embodiment of the present invention.

This embodiment is described in detail with reference to a specific example. Referring to FIG. 4, a schematic structural diagram of a reference voltage temperature coefficient calibration circuit according to a first embodiment of the present invention is given. As illustrated in FIG. 4, the transistor M1 and the transistor M2 in the input pair transistor 211 are NMOS transistors, and the transistor M3 and the transistor M4 in the load pair transistor 212 are PMOS transistors, wherein the gate of the NMOS transistor M1 is connected to the reference voltage $V_{in}$ before calibration, an offset voltage $V_{os}$ exists at the reference voltage $V_{in}$ before calibration, the source of the NMOS transistor M1 and the source of the NMOS transistor M2 are both connected to the negative pole of the bias current source $I_s$, the gate of the NMOS transistor M2 is connected to the reference voltage $V_{out}$ after calibration, the positive pole of the bias current source $I_s$ is connected to the ground, the gate of the PMOS transistor M3 is connected to the drain of the NMOS transistor M1 after being connected to the gate of the PMOS transistor M4, the drain of the PMOS transistor M3 is connected to the adjustable current module 22 after being connected to the drain of the NMOS transistor M1, the drain of the PMOS transistor M4 is connected to the adjustable current module 22 after being connected to the drain of the NMOS transistor M2, the drain of the PMOS transistor M4 is connected to the reference voltage $V_{out}$ after calibration after being connected to the drain of the NMOS transistor M2, and the source of the PMOS transistor M3, the source of the PMOS transistor M4 and the adjustable current module 22 are all connected to the power supply $V_{DD}$.

In this embodiment, the NMOS transistor M1 and the NMOS transistor M2 operate in a sub-threshold region, the current value of the bias current source $I_s$ is far greater than the current value of the adjustable current module 22, and the PMOS transistor M3 and the PMOS transistor M4 are current mirror transistors with the current ratio of 1:1. It is assumed that the currents on the PMOS transistor M3 and the PMOS transistor M4 are respectively $I_{p3}$ and $I_{p4}$, and $I_{p3}=I_{p4}$, the adjusting current generated by the adjustable current module 22 is related to the current of the bias current source $I_s$ and an order of Kelvin temperature, then the offset current $I_{os}$ flowing through the NMOS transistor M1 and the NMOS transistor M2 is specifically the difference between the currents of the drain and the source flowing through the NMOS transistor M1 and the NMOS transistor M2. The offset current $I_{os}$ is represented by Equation (3):

$$I_{OS} = I_{p3} - I_{p4} + k_1 I_s + k_2 I_s T + \ldots + k_n I_s T^{n-1} = \quad (3)$$
$$k_1 I_s + k_2 I_s T + \ldots + k_n I_s T^{n-1}$$

Assume that the transconductance is $g_m$, then according to the basic knowledge of the circuit, $$g_m \approx \frac{I_s}{2\eta V_T} \quad (4)$$

the offset voltage $V_{os}$ may be expressed by Equation (5):

$$V_{OS} = \frac{I_{OS}}{g_m} \approx \frac{k_1 I_s + k_2 I_s T + \ldots + k_n I_s T^{n-1}}{I_s} 2\eta V_T = \quad (5)$$
$$(k_1 + k_2 T + \ldots + k_n T^{n-1}) 2\eta V_T$$

Then, the reference voltage $V_{out}$ after calibration may be expressed by Equation (6):

$$V_{out} = V_{in} + V_{os} = V_{REF} + (k_1 + k_2 T + \ldots + k_n T^{n-1}) 2\eta V_T = \quad (6)$$
$$V_{REF} + \frac{(k_1 + k_2 T + \ldots + k_n T^{n-1})}{q} 2\eta k T =$$
$$V_{REF} + \frac{2\eta k}{q} k_1 T + \frac{2\eta k}{q} k_2 T^2 + \ldots + \frac{2\eta k}{q} k_n T^n$$

Therefore, the temperature coefficient of the offset voltage is adjusted through adjusting the values of $K_1, K_2, \ldots, K_n$ according to Equation (6) so as to implement calibration of the reference voltage temperature coefficient.

In this embodiment, the adjustable current generates an adjusting current. Since the adjusting current is related to the current at the bias current source in the operational amplifier and the order of the Kelvin temperature, the offset current is adjusted by adjusting the adjusting current according to different temperature orders. In this way, the first order to high order temperature coefficients of the offset voltage are adjusted, the temperature coefficient of the reference voltage is calibrated, and universality is achieved.

Optionally, in this embodiment, in the input pair transistor 211, the transistor M1 and the transistor M2 may be NMOS transistors or NPN transistors; in the load pair transistor 212, the transistor M3 and the transistor M4 may be PMOS transistors. Referring to the schematic structural diagram in FIG. 2, the adjustable current module 22 may comprise adjustable current sources $I_{11}, I_{21}, \ldots, I_{1n}, I_{2n}$ connected in parallel, wherein the adjustable current sources $I_{11}, I_{21}, \ldots, I_{1n}, I_{2n}$ may be arranged on two sides of the load pair transistor 212 and connected in parallel to the load pair transistor 212, and the negative poles of the adjustable current sources $I_{11}, I_{21}, \ldots, I_{1n}, I_{2n}$ are all connected to the power supply $V_{DD}$. Specifically, in the input pair transistor 211, the transistor M1 and the transistor M2 may be NMOS transistors, wherein the gate of the NMOS transistor M1 is connected to the reference voltage $V_{in}$ before calibration, the source of the NMOS transistor M1 is connected to the negative pole of the bias current source $I_s$ and the source of the NMOS transistor M2, the drain of the NMOS transistor M1 is connected to the positive poles of the adjustable current sources $I_{11}, \ldots, I_{1n}$ after being connected to the drain of the PMOS transistor M3, the drain of the NMOS transistor M2 is connected to the positive poles of the adjustable current sources $I_{21}, \ldots, I_{2n}$ after being connected to the drain of the PMOS transistor M4, the gate of the NMOS transistor M2 is connected to the reference voltage $V_{out}$ after calibration after being connected to the drain thereof, the gate of the PMOS transistor M3 is connected to the drain of the NMOS transistor M1 after being connected to the gate of the PMOS transistor M4, the source of the PMOS transistor M3 and the source of the PMOS transistor M4 are both connected to the power supply $V_{DD}$, and the positive pole of the bias current source $I_s$ is connected to the ground; in the input pair transistor 211, the transistor M1 and the transistor M2 may be NPN transistors, wherein the base of the NPN transistor M1 is connected to the reference voltage $V_{in}$ before calibration, the emitter of the NPN transistor M1 is connected to the negative pole of the bias current source $I_s$ and the emitter of the NPN transistor M2, the collector of the NPN transistor M1 is connected to the positive poles of the adjustable current sources $I_{11}, \ldots, I_{1n}$ after being connected to the drain of the PMOS transistor M3, the collector of the NPN transistor M3 is connected to the positive poles of the adjustable current sources $I_{21}, \ldots, I_{2n}$ after being connected to the drain of the PMOS transistor M4, the base of the NPN transistor M2 is connected to the reference voltage $V_{out}$ after calibration after being connected to the collector thereof, the gate of the PMOS transistor M3 is connected to the collector of the NPN transistor M1 after being connected to the gate of the PMPS transistor M4, the source of the PMOS transistor M3 and the source of the PMOS transistor M4 are both connected to the power supply $V_{DD}$, and the positive pole of the bias current source $I_s$ is connected to the ground.

Optionally, in this embodiment, in the input pair transistor 211, the transistor M1 and the transistor M2 may be NMOS transistors or NPN transistors; in the load pair transistor 212, the transistor M3 and the transistor M4 may be PNP transistors. Referring to the schematic structural diagram in FIG. 2, the adjustable current module 22 may comprise adjustable current sources $I_{11}, I_{21}, \ldots, I_{1n}, I_{2n}$ connected in parallel, wherein the adjustable current sources $I_{11}, I_{21}, \ldots, I_{1n}, I_{2n}$ may be arranged on two sides of the load pair transistor 212 and connected in parallel to the load pair transistor 212, and the negative poles of the adjustable current sources $I_{11}, I_{21}, \ldots, I_{1n}, I_{2n}$ are all connected to the power supply $V_{DD}$. Specifically, in the input pair transistor 211, the transistor M1 and the transistor M2 may be NMOS transistors, wherein the gate of the NMOS transistor M1 is connected to the reference voltage $V_{in}$ before calibration, the source of the NMOS transistor M1 is connected to the negative pole of the bias current source $I_s$ and the source of the NMOS transistor M2, the drain of the NMOS transistor M1 is connected to the positive poles of the adjustable current sources $I_{11}, \ldots, I_{1n}$ after being connected to the emitter of the PNP transistor M3, the drain of the NMOS transistor M2 is connected to the positive poles of the adjustable current sources $I_{21}, \ldots, I_{2n}$ after being connected to the emitter of the PNP transistor M3, the gate of the NMOS transistor M2 is connected to the reference voltage $V_{out}$ after calibration after being connected to the drain thereof, the base of the PNP transistor M2 is connected to the drain of the NMOS transistor M1 after being connected to the base of the PNP transistor M4, the emitter of the PNP transistor M3 and the emitter of the PNP transistor M4 are both connected to the power supply $V_{DD}$, and the positive pole of the bias current source $I_s$ is connected to the ground; in the input pair transistor 211, the transistor M2 and the transistor M2 may be NPN transistors, wherein the base of the NPN transistor is connected to the reference voltage $V_{in}$ before calibration, the emitter of the NPN transistor M1 is connected to the negative pole of the bias current source $I_s$ and the emitter of the NPN transistor M2, the collector of the NPN transistor M1 is connected to the positive poles of the adjustable current sources $I_{11}, \ldots, I_{1n}$ after being connected to the collector of the PNP transistor M3, the collector of the NPN transistor M2 is connected to the positive poles of the adjustable current sources $I_{21}, \ldots, I_{2n}$ after being connected to the collector of the PNP transistor M4, the base of the NPN transistor M2 is connected to the reference voltage $V_{out}$ after calibration after being connected to the collector thereof, the base of the PNP transistor M3 is connected to the collector of the NPN transistor M1 after being connected to the base of the PNP transistor M4, the emitter of the PNP transistor M3 and the emitter of the PNP transistor M4 are both connected to the power supply $V_{DD}$, and the positive pole of the bias current source $I_s$ is connected to the ground.

Optionally, in this embodiment, in the input pair transistor 211, the transistor M1 and the transistor M2 may be PMOS transistors or PNP transistors; in the load pair transistor 212, the transistor M3 and the transistor M4 may be NMOS transistors. Referring to the schematic structural diagram in FIG. 3, the adjustable current module 22 may comprise adjustable current sources $I_{11}, I_{21}, \ldots, I_{1n}, I_{2n}$ connected in parallel, wherein the adjustable current sources $I_{11}, I_{21}, \ldots, I_{1n}, I_{2n}$ may be arranged on two sides of the load pair transistor 212 and connected in parallel to the load pair transistor 212, and the positive poles of the adjustable current sources $I_{11}, I_{21}, \ldots, I_{1n}, I_{2n}$ are all connected to the ground. Specifically, in the input transistor 211, the transistor M1 and the transistor M2 may be PMOS transistors, wherein the gate of the PMOS transistor M1 is connected to the reference voltage $V_{in}$ before calibration, the source of the PMOS transistor M1 is connected to the positive pole of the bias current source and the source of the PMOS transistor M2, the drain of the PMOS transistor M1 is connected to the negative poles of the adjustable current sources $I_{11}, \ldots, I_{1n}$ after being connected to the drain of the NMOS transistor M3, the drain of the PMOS transistor M2 is connected to the negative poles of the $I_{21}, \ldots, I_{2n}$ after being connected to the drain of the NMOS transistor M4, the gate of the PMOS transistor M2 is connected to the reference voltage $V_{out}$ after calibration after being connected to the collector thereof, the gate of the NMOS transistor M3 is connected to the drain of the PMOS transistor M1 after being connected to the gate of the NMOS transistor M4, the source of the NMOS transistor M3 and the source of the NMOS transistor M4 are both connected to the ground, the negative pole of the bias current source $I_s$ is connected to the power supply $V_{DD}$; in the input pair transistor 211, the transistor M1 and the transistor M2 may be PNP transistors, wherein the base of the PNP transistor M1 is connected to the reference voltage $V_{in}$ before calibration, the emitter of the PNP transistor M1 is connected to the positive pole of the bias current source $I_s$ and the emitter of the PNP transistor M2, the collector of the PNP transistor M1 is connected to the negative poles of the adjustable current sources $I_{11}, \ldots, I_{1n}$ after being connected to the drain of the NMOS transistor M3, the collector of the PNP transistor M2 is connected to the negative poles of the adjustable current sources $I_{21}, \ldots, I_{2n}$ after being connected to the drain of the NMOS transistor M4, the base of the PNP transistor M2 is connected to the reference voltage after calibration after being connected to the drain of the NMOS transistor M4, the gate of the NMOS transistor M3 is connected to the collector of the PNP transistor M1 after being connected to the gate of the NMOS transistor M4, the source of the NMOS transistor M3 and the source of the NMOS transistor M4 are both connected to the ground, and the negative pole of the bias current source $I_s$ is connected to the power supply $V_{DD}$.

Optionally, in this embodiment, in the input pair transistor 211, the transistor M1 and the transistor M2 may be PMOS transistors or PNP transistors; in the load pair transistor 212, the transistor M3 and the transistor M4 may be PNP transistors. Referring to the schematic structural diagram in FIG. 3, the adjustable current module 22 may comprise adjustable current sources $I_{11}, I_{21}, \ldots, I_{1n}, I_{2n}$ connected in parallel, wherein the adjustable current sources $I_{11}, I_{21}, \ldots, I_{1n}, I_{2n}$ may be arranged on two sides of the load pair transistor 212 and connected in parallel to the load pair transistor 212, and the positive poles of the adjustable current sources $I_{11}, I_{21}, \ldots, I_{1n}, I_{2n}$ are all connected to the power supply $V_{DD}$. Specifically, in the input pair transistor 211, the transistor M1 and the transistor M2 may be PMOS transistors, wherein the gate of the PMPS transistor M1 is connected to the reference voltage $V_{in}$ before calibration, the source of the PMOS transistor M1 is connected to the positive pole of the bias current source $I_s$ and the source of the PMOS transistor M2, the drain of the PMOS transistor M1 is connected to the negative poles of the adjustable current sources $I_{11}, \ldots, I_{1n}$ after being connected to the collector of the NPN transistor M3, the drain of the PMOS transistor M2 is connected to the negative poles of the adjustable current sources $I_{21}, \ldots, I_{2n}$ after being connected to the collector of the NPN transistor M4, the gate of the PMOS transistor M2 is connected to the reference voltage $V_{out}$ after calibration after being connected to the collector thereof, the base of the NPN transistor M3 is connected to the drain of the PMOS transistor M1 after being connected to the base of the NPN transistor M4, the emitter of the NPN transistor M3 and the emitter of the NPN transistor M4 are both connected to the ground, the negative pole of the bias current source $I_s$ is connected to the power supply $V_{DD}$; in the input pair transistor 211, the transistor M1 and the transistor M2 may be PNP transistors, wherein the base of the PNP transistor M1 is connected to the reference voltage $V_{in}$ before calibration, the emitter of the PNP transistor M1 is connected to the positive pole of the bias current source $I_s$ and the emitter of the PNP transistor M2, the collector of the PNP transistor M1 is connected to the negative poles of the adjustable current sources $I_{11}, \ldots, I_{1n}$ after being connected to the collector of the NPN transistor M3, the collector of the PNP transistor M2 is connected to the negative poles of the adjustable current sources $I_{21}, \ldots, I_{2n}$ after being connected to the collector of the NPN transistor M4, the base of the PNP transistor M2 is connected to the reference voltage $V_{out}$ after calibration after being connected to the collector thereof, the base of the NPN transistor M3 is connected to the collector of the PNP transistor M1 after being connected to the base of the NPN transistor M4, the emitter of the NPN transistor M3 and the emitter of the NPN transistor M4 are both connected to the ground, and the negative pole of the bias current source $I_s$ is connected to the power supply $V_{DD}$.

Optionally, in this embodiment, the adjustable current sources $I_{11}, I_{21}, \ldots, I_{1n}, I_{2n}$ may also be arranged on one side of a transistor (for example, the transistor M3 or the transistor M4 as illustrated in FIG. 2) of the load input pair transistor 212 and connected in parallel to the transistor. The specific connections may be referenced to the above case where the adjustable current sources $I_{11}, I_{21}, \ldots, I_{1n}, I_{2n}$ are arranged on two sides of the load pair transistor 212 and connected in parallel to the load pair transistor 212 when the transistor M1 and the transistor M2 in the input pair transistor 211 are NMOS transistors or NPN transistors, and the transistor M3 and the transistor M4 in the load pair transistor 212 are PMOS transistors or PNP transistors; or when the transistor M1 and the transistor M2 in the input pair transistor 211 are PMOS transistors or PNP transistors, and the transistor M3 and the transistor M4 in the load pair transistor 212 are NMOS transistors or NPN transistors, which are not described herein any further.

Optionally, in this embodiment, the current value of the bias current source $I_s$ may be over ten times of the current value of the adjustable current sources $I_{11}, I_{21}, \ldots, I_{1n}, I_{2n}$, that is, the current value of the bias current source $I_s$ is far greater than the current value of the adjustable current sources $I_{11}, I_{21}, \ldots, I_{1n}, I_{2n}$. As known from Equation (6), the adjustable current module 22 may adjust the values of $k_1, k_2, \ldots, k_n$ by adjusting an adjustment proportion of the currents on the adjustable current sources $I_{11}, I_{21}, \ldots, I_{1n}, I_{2n}$, such that different orders of temperature coefficients of the offset voltage are adjusted, thereby implementing adjustment of the first-order to high-order temperature coefficients of the offset voltage.

Optionally, in this embodiment, the input pair transistor 211 is an NMOS transistor or a PMOS transistor, and the input pair transistor 211 operates in a sub-threshold region because when the temperature coefficient of the offset voltage is adjusted, the drain current on the input pair transistor 211 is represented by Equation (7):

$$I_D = \frac{W}{L} I_0 \exp\left(\frac{V_{gs} - V_{th}}{\eta V_T}\right) \quad (7)$$

In Equation (7), $I_D$ is a drain current of the MOS transistor, W/L is a wide-to-length ratio of the NMOS transistor, $I_0$ is an intrinsic current, $V_{gs}$ is a gate-source voltage of the NMOS transistor N1, and $V_{th}$ is a threshold voltage.

As known from Equation (7), the drain current is in an exponential relation to the gate voltage. However, with respect to a MOS transistor, the drain current changes exponentially against the gate voltage in the sub-threshold region. Therefore, when the input pair transistor 211 is an NMOS transistor or a PMOS transistor, the input pair transistor 211 operates in the sub-threshold region.

Optionally, in this embodiment, the adjustable current module 22 may further comprise a switch, by using which connection or disconnection of the adjustable current source may be controlled.

Optionally, in this embodiment, the adjustable current sources $I_{11}, I_{21}, \ldots, I_{1n}, I_{2n}$ are in one-to-one correspondence with the switch. Specifically, the transistor M1 and the transistor M2 in the input pair transistor 211 are NMOS transistors or NPN transistors, and the transistor M3 and the transistor M1 in the load pair transistor 212 are PMOS transistors or NPN transistors. One terminal of the switch is connected to the positive pole of the adjustable current source corresponding to the switch, the transistor M3 and the transistor M1 are connected in series and then connected to the other terminal of the switch, and/or the transistor M4 and the transistor M2 are connected in series and then connected to the other terminal of the switch. One terminal of the switch is connected to the power supply $V_{DD}$, and the other terminal of the switch is connected to the negative pole of the adjustable current source corresponding to the switch. The transistor M1 and the transistor M2 in the input pair transistor 211 are PMOS transistors or PNP transistors, and the transistor M3 and the transistor M1 in the load pair transistor 212 are NMOS transistors or NPN transistors. One terminal of the switch is connected to the negative pole of the adjustable current source corresponding to the switch, the transistors M3 and the transistor M1 are connected in series and then connected to the other terminal of the switch, and/or the transistor M4 and the transistor M2 are connected in series and then connected to the other terminal of the switch. One terminal of the switch is connected to the ground, and the other terminal of the switch is connected to the positive pole of the adjustable current source corresponding to the switch.

Optionally, in this embodiment, the adjustable current sources $I_{11}, I_{21}, \ldots, I_{1n}, I_{2n}$ may also not be a one-to-one correspondence with the switch. If the transistor M1 and the transistor M2 in the input pair transistor 212 are MOS transistors, the offset current is a difference of the drain-source currents of the MOS transistor M1 and the MOS transistor M2. If the transistor M1 and the transistor M2 in the input pair transistor 211 are PNP transistors or NPN transistors, the offset current is a difference of the collector-emitter currents of the PNP transistor M1 and the PNP transistor M2 or the NPN transistor M1 and the NPN transistor M2. As known from Equation (6), the adjustable current module 22 may adjust the values of $k_1, k_2, \ldots, k_n$ by adjusting an adjustment proportion of the currents on the adjustable current sources $I_{11}$, $I_{21}$, ..., $I_{1n}$, $I_{2n}$ and by controlling connection or disconnection of the switch, such that different orders of temperature coefficients of the offset voltage are adjusted, thereby implementing adjustment of the first-order to high-order temperature coefficients of the offset voltage. Therefore, during adjusting of an order of temperature coefficient of the offset voltage, if the adjustable current sources corresponding to this order of temperature coefficient are arranged on two sides of the load pair transistor 212 and are connected in parallel to the load pair transistor 212, the adjustable current source corresponding to this order of coefficient may correspond to one or more than one switch, or may correspond to no switch. Similarly, if the adjustable current sources corresponding to this order of coefficient is arranged on one side of a transistor of the load pair transistor 212 (for example, the transistor M3 or the transistor M4 in FIG. 2) and connected in parallel to the transistor, the adjustable current source may correspond to one or more than one switch, or may correspond to no switch. For example, assume that the adjustable current sources $I_{11}$ and $I_{12}$ are respectively arranged on two sides of the load pair transistor 212, are connected in parallel to the load pair transistor 212 and correspond to the first-order temperature coefficient of the offset voltage, and the adjustable current source $I_{11}$ is corresponds to a switch S1, then if the adjustable current $I_{12}$ correspond to a switch S2, the first-order temperature coefficient of the offset voltage may be adjusted by controlling connection or disconnection of the switches S1 and S2 and by adjusting an adjustment proportion of the currents on the adjustable current sources $I_{11}$ and $I_{12}$. In this case, it may be considered that the adjustable current source $I_{12}$ corresponds to a switch that is constantly in a connection state, and the first-order temperature coefficient of the offset voltage may be adjusted by controlling connection or disconnection of the switch S1 and by adjusting an adjustment proportion of the current on the adjustable current sources $I_{11}$ and $I_{12}$. Assume that the adjustable current source $I_{11}$ corresponds to no switch, then if the adjustable current source $I_{12}$ corresponds to the switch S2, it is considered that the adjustable current source $I_{11}$ corresponds to a switch that is constantly in a connection state, and the first-order temperature coefficient of the offset voltage may be adjusted by controlling connection or disconnection of the switch S2 and by adjusting an adjustment proportion of the current on the adjustable current sources $I_{11}$ and $I_{12}$. However, if the adjustable current source $I_{12}$ also corresponds to no switch, it is considered that the adjustable current source $I_{11}$ corresponds to a switch that is constantly in a connection state, and the adjustable current source $I_{12}$ also corresponds to a switch that is constantly in a connection state, and in this case, the first-order temperature coefficient of the offset voltage may be adjusted by adjusting an adjustment proportion of the current on the adjustable current sources $I_{11}$ and $I_{12}$.

Figure 5:
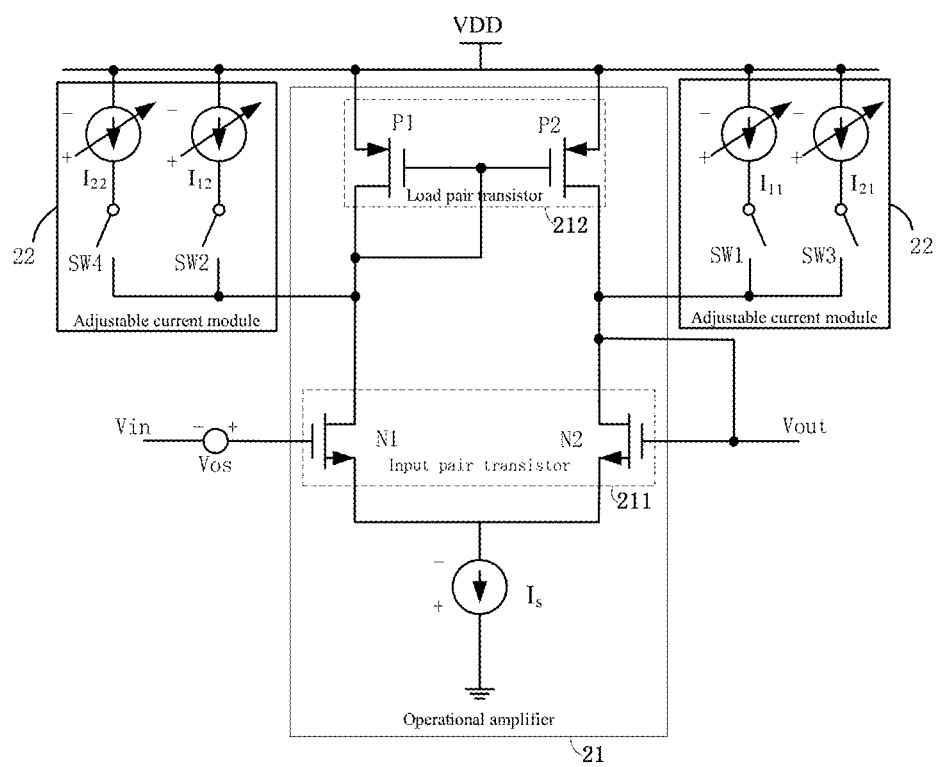
FIG. 5 is a schematic structural diagram illustrating a reference voltage temperature coefficient calibration circuit according to a second embodiment of the present invention.

Referring to FIG. 5, a schematic structural diagram illustrating a reference voltage temperature coefficient calibration circuit according to a second embodiment of the present invention is given. In this embodiment, the transistor M1 and the transistor M2 in the input pair transistor 211 are specifically an NMOS transistor N1 and an NMOS transistor N2, the transistor M3 and the transistor M4 in the load pair transistor 212 are specifically a PMOS transistor P1 and a PMOS transistor P2, and the adjustable current module 22 is arranged on two sides of the load pair transistor 212 and is connected in parallel to the load pair transistor 212. The adjustable current module 22 comprises an adjustable current source and a switch. The adjustable current sources $I_{11}$, $I_{21}$, ..., $I_{1n}$, $I_{2n}$ may be specifically an adjustable current source $I_{11}$, an adjustable current source $I_{12}$, an adjustable current source $I_{21}$, and an adjustable current source $I_{22}$, which are in a one-to-one correspondence with the switch. Specifically, the adjustable current source $I_{11}$ may correspond to a switch SW1, the adjustable current source $I_{12}$ may correspond to a switch SW2, the adjustable current source $I_{21}$ may correspond to a switch SW3, and the adjustable current source $I_{22}$ may correspond to a switch SW4. The negative poles of the adjustable current source $I_{11}$, the adjustable current source $I_{12}$, the adjustable current source $I_{21}$ and the adjustable current source $I_{22}$ are all connected to the power supply $V_{DD}$. One terminal of the switch SW1 may be connected to the positive pole of the adjustable current source $I_{11}$, the switch SW2 may be connected to the positive pole of the adjustable current source $I_{12}$, the switch SW3 may be connected to the positive pole of the adjustable current source $I_{21}$, and the switch SW4 may be connected to the positive pole of the adjustable current source $I_{22}$. The gate of the NMOS transistor N1 is connected to the reference voltage $V_{in}$ before calibration, an offset voltage $V_{os}$ exists at the reference voltage $V_{in}$ before calibration, the source of the NMOS transistor N1 is connected to the negative pole of the bias current source $I_s$, the drain of the NMOS transistor N1 is connected to the other terminals of the switch SW2 and the switch SW2 in the adjustable current module 22 after being connected to the drain of the PMOS transistor P1, the gate of the NMOS transistor N1 is connected to the reference voltage $V_{out}$ after calibration after being connected to the drain thereof, the source of the NMOS transistor N2 is connected to the negative pole of the bias current source $I_s$, the drain of the NMOS transistor N2 is connected to the other terminals of the switch SW1 and the switch SW3 in the adjustable current module 22 after being connected to the drain of the PMOS transistor P2, the gate of the PMOS transistor is connected to the drain of the NMOS transistor N1 after being connected to the gate of the PMOS transistor P2, the source of the PMOS transistor P1 and the source of the PMOS transistor P2 are both connected to the power supply $V_{DD}$, and the positive pole of the bias current source $I_s$ is connected to the ground.

In the above embodiment, the NMOS transistor N1 and the NMOS transistor N2 operate in a sub-threshold region, the current value of the bias current source $I_s$ is far greater than the current values of the adjustable current source $I_{21}$, the adjustable current source $I_{22}$, the adjustable current source $I_{31}$, and the adjustable current source $I_{32}$, and the PMOS transistor P1 and the PMOS transistor P2 are current mirror transistors with a current ratio of 1:1.

A, B, C, and D respectively represent connection or disconnection of the switches SW1, SW2, SW3, and SW4. When the switch SW is connected, A=1, and when the switch SW1 is disconnected, A=0; when the switch SW2 is connected, B=1, and when the switch SW2 is disconnected, B=0; when the switch SW3 is connected, C=1, and when the switch SW3 is disconnected, C=0; when the switch SW4 is connected, D=1, and when the switch SW4 is disconnected, D=0. Assume that the offset current is $I_{os}$, the drain-source currents of the PMOS transistor P1 and the PMOS transistor P2 in the load pair transistor 212 are respectively $I_{p1}$ and $I_{p2}$, then since the offset current herein is a difference of drain-source currents of the NMOS transistor N1 and the NMOS transistor N2 in the input pair transistor 211, and $I_{p1}=I_{p2}$, the offset current $I_{os}$ is represented by Equation (8):

$$I_{OS}=I_{p2}+AI_{11}+CI_{21}-(I_{p1}+BI_{12}+DI_{22})=AI_{11}-BI_{12}+CI_{21}-DI_{22} \quad (8)$$

The offset voltage $V_{os}$ obtained from the $I_{os}$ may be expressed by Equation (9):

$$V_{OS} = \frac{I_{OS}}{g_m} \approx \frac{AI_{11} - BI_{12} + CI_{21} - DI_{22}}{I_s} 2\eta V_T \quad (9)$$

Adjustment of the temperature coefficient of the offset voltage $V_{os}$ may be specifically as follows: Assume that $I_{11}=I_{12}=xI_s$, x is the adjustment proportion of the adjusting currents of the adjustable current source $I_{11}$ and the adjustable current source $I_{12}$, then the option $2\eta V_T$ has a coefficient of (A−B)x, and the value of (A−B)x is changed by controlling connection or disconnection of the switch SW1 and the switch SW2 and by adjusting the value of the adjustment proportion x of the adjustable current source $I_{11}$ and the adjustable current source $I_{12}$, such that the first-order temperature coefficient of the offset voltage $V_{os}$ may be adjusted. Similarly, assume that $I_{21}=I_{22}=y\,I_sT/T0$, wherein y is an adjustment proportion of the adjusting currents of the adjustable current source $I_{11}$ and the adjustable current source $I_{12}$ at a temperature T0, then the option $2\eta V_T$ has a coefficient of (C−D)yT/T0, and the value of (C−D)yT/T0 is changed by controlling connection or disconnection of the switch SW3 and the switch SW4 and by adjusting the adjustment proportion y of the adjustable current source $I_{11}$ and the adjustable current source $I_{12}$, thereby implementing adjustment of the second-order temperature coefficient of the offset voltage $V_{os}$.

According to the above relationship, it may be known that the reference voltage $V_{out}$ after calibration is represented by Equation (10):

$$V_{out} = V_{in} + V_{os} = V_{os} = V_{REF} + \frac{2\eta k(A-B)x}{q}T + \frac{2\eta k(C-D)y}{qT_0}T^2 \quad (10)$$

In Equation (10), the first-order temperature coefficient of $V_{out}$ is $$\frac{2\eta k(A-B)x}{q},$$

and the second-order temperature coefficient of $V_{out}$ is $$\frac{2\eta k(C-D)y}{qT_0}.$$

Through the above process, the first-order temperature coefficient and the second-order temperature coefficient may be adjusted by adjusting the adjustment proportion of the adjusting current of the corresponding adjustable current source and by controlling connection or disconnection of the switch, thereby implementing calibration of the temperature coefficient of the reference voltage.

Optionally, in the above embodiment, the number of adjustable current sources connected in parallel may be changed, and adjustment of the first-order to high-order temperature coefficients of the offset voltage $V_{os}$ may be implemented by adjusting the adjustment proportion of the adjusting current of the adjustable current source and by controlling connection or disconnection of the switch corresponding to the adjustable current source, thereby implementing calibration of the temperature coefficient of the reference voltage.

Figure 6:
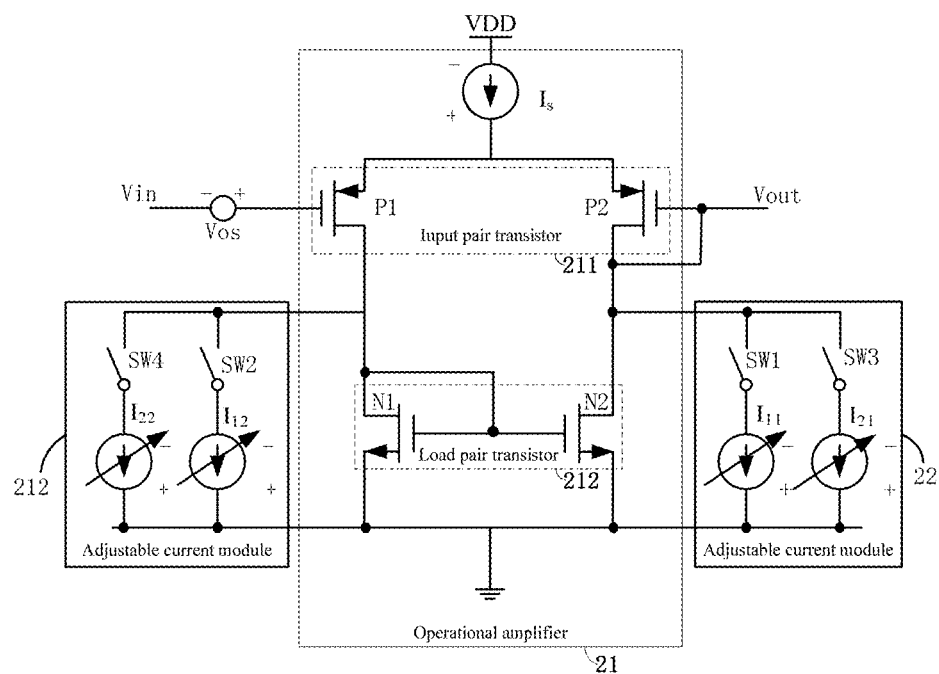
FIG. 6 is a schematic structural diagram illustrating a reference voltage temperature coefficient calibration circuit according to a third embodiment of the present invention.

Referring to FIG. 6, a schematic structural diagram illustrating a reference voltage temperature coefficient calibration circuit according to a third embodiment of the present invention is given. Different from FIG. 5, the input pair transistor 211 comprises PMOS transistors P1 and P2, the load pair transistor comprises NMOS transistors N1 and N2, the positive poles of the adjustable current sources $I_{11}$, $I_{12}$, $I_{21}$ and $I_{22}$ are all connected to the ground, one terminal of the switch SW1 is connected to the negative pole of the adjustable current source $I_{11}$, the switch SW2 is connected to the negative pole of the adjustable current source $I_{12}$, the switch SW3 is connected to the negative pole of the adjustable current source $I_{21}$, the switch SW4 is connected to the negative pole of the adjustable current source $I_{22}$, the gate of the PMOS transistor P1 is connected to the reference voltage $V_{in}$ before calibration, the source of the PMOS transistor P1 is connected to the positive pole of the bias current source $I_s$, the drain of the PMOS transistor P1 is connected to the other terminals of the switch SW2 and the switch SW4 in the adjustable current module 22 after being connected to the drain of the NMOS transistor N1, the gate of the PMOS transistor P2 is connected to the reference voltage $V_{out}$ after calibration after being connected to the drain thereof, the source of the PMOS transistor P2 is connected to the positive pole of the bias current source $I_s$, the drain of the PMOS transistor P2 is connected to the other terminals of the switch SW1 and the switch SW3 in the adjustable current module 22 after being connected to the drain of the NMOS transistor N2, the gate of the NMOS transistor N1 is connected to the drain of the PMOS transistor P1 after being connected to the gate of the NMOS transistor N2, the source of the NMOS transistor N1 and the source of the NMOS transistor N2 are both connected to the ground, and the negative pole of the bias current source $I_s$ is connected to the power supply $V_{DD}$.

According to the calculation method as illustrated in FIG. 5, it may be known that the equations representing the offset voltage $V_{os}$ and the reference voltage $V_{out}$ after calibration in FIG. 6 are consistent with the equations representing the offset voltage $V_{os}$ and the reference voltage $V_{out}$ after calibration in FIG. 5. Therefore, the offset voltage $V_{os}$ may be adjusted by using the same adjustment process, thereby achieving calibration of the temperature coefficient of the reference voltage, which is not described herein any further.

It should be finally noted that the above embodiments are merely for illustrating the technical solution of the present invention instead of limiting the technical solution of the present invention. Although the present invention is described in detail with reference to preferable embodiments, persons of ordinary skill in the art shall understand that various modifications or equivalent replacements made to the technical solution of the present invention without departing from the spirit and scope of the present invention shall all covered within the scope of the present invention.

What is claimed is:

1. A reference voltage temperature coefficient calibration circuit, comprising:

an operational amplifier comprising an input pair transistor, a load pair transistor, and a bias current source, an inverted input terminal of the operational amplifier being connected to an output terminal of the operational amplifier; and an adjustable current module connected in parallel to the load pair transistor, the adjustable current module being configured to generate an adjusting current, the adjusting current being used to adjust an offset current flowing through the input pair transistor, wherein the adjusting current is related to a current of the bias current source and an order of Kelvin temperature.

2. The circuit according to claim 1, wherein the input pair transistor is an NMOS transistor or an NPN transistor, and the load pair transistor is a PMOS transistor or a PNP transistor; or the input pair transistor is a PMOS transistor or a PNP transistor, and the load pair transistor is an NMOS transistor or an NPN transistor.

3. The circuit according to claim 1, wherein the input pair transistor is an NMOS transistor or a PMOS transistor, and the input pair transistor works in a sub-threshold region.

4. The circuit according to claim 1, wherein the adjustable current module comprises more than one adjustable current source connected in parallel.

5. The circuit according to claim 4, wherein the adjustable current module further comprises a switch by using which connection or disconnection of the adjustable current source is controlled.

6. A reference circuit calibration method, comprising:

providing an operational amplifier, the operational amplifier comprising an input pair transistor, a load pair transistor, and a bias current source, an inverted input terminal of the operational amplifier being connected to an output terminal of the operational amplifier; and providing an adjustable current module, the adjustable current module being connected in parallel to the load pair transistor, the adjustable current module being configured to generate an adjusting current, the adjusting current being used to adjust an offset current flowing through the input pair transistor, wherein the adjusting current is related to a current of the bias current source and an order of Kelvin temperature.

7. The method according to claim 6, wherein the input pair transistor is an NMOS transistor or an NPN transistor, and the load pair transistor is a PMOS transistor or a PNP transistor; or the input pair transistor is a PMOS transistor or a PNP transistor, and the load pair transistor is an NMOS transistor or an NPN transistor.

8. The method according to claim 6, wherein the input pair transistor is an NMOS transistor or a PMOS transistor, and the input pair transistor works in a sub-threshold region.

9. The method according to claim 6, wherein the adjustable current module comprises more than one adjustable current source connected in parallel.

10. The method according to claim 9, wherein the adjustable current module further comprises a switch by using which connection or disconnection of the adjustable current source is controlled.

* * * * *